US010919391B2

(12) United States Patent
Ogaki et al.

(10) Patent No.: US 10,919,391 B2
(45) Date of Patent: Feb. 16, 2021

(54) COOLING APPARATUS CAPABLE OF DETERMINING VALVE MALFUNCTION

(71) Applicant: HONDA MOTOR CO., LTD., Tokyo (JP)

(72) Inventors: Toru Ogaki, Saitama (JP); Takashi Ogane, Saitama (JP); Naoto Doi, Saitama (JP); Keisuke Fujimaki, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 30 days.

(21) Appl. No.: 15/773,199

(22) PCT Filed: Nov. 4, 2016

(86) PCT No.: PCT/JP2016/082880
§ 371 (c)(1),
(2) Date: May 3, 2018

(87) PCT Pub. No.: WO2017/094444
PCT Pub. Date: Jun. 8, 2017

(65) Prior Publication Data
US 2018/0321000 A1    Nov. 8, 2018

(30) Foreign Application Priority Data
Dec. 3, 2015  (JP) .................. 2015-236713

(51) Int. Cl.
*H01M 10/613*   (2014.01)
*B60L 58/26*    (2019.01)
(Continued)

(52) U.S. Cl.
CPC .................. *B60L 3/00* (2013.01); *B60K 6/22* (2013.01); *B60K 11/04* (2013.01); *B60L 58/26* (2019.02);
(Continued)

(58) Field of Classification Search
CPC ....... F01P 11/16; F28F 27/02; F16K 37/0091; H01M 10/613; H01M 10/625;
(Continued)

(56) References Cited

U.S. PATENT DOCUMENTS 6,246,950 B1 *  6/2001  Bessler ................. F01P 11/16
                                                318/473
6,763,709 B1 *  7/2004  Haggett ................ F01P 11/16
                                                73/114.68

(Continued)

FOREIGN PATENT DOCUMENTS

CN    103770600 A    5/2014
JP    H04-203876 A   7/1992
(Continued)

OTHER PUBLICATIONS

Jan. 17, 2017, International Search Report issued for related JP application No. PCT/JP2016/082880.

(Continued)

*Primary Examiner* — Paul Alvare
(74) *Attorney, Agent, or Firm* — Paratus Law Group, PLLC

(57) ABSTRACT

A cooling apparatus includes: a cooling circuit that includes three flow passages intersecting at an intersection point and allows a cooling liquid to circulate therethrough; a three-way valve that is disposed at the intersection point and is switchable such that any two of the three flow passages communicate with each other; and a controller that controls switching of the three-way valve. The controller includes an intermediate fixation determination unit. The intermediate fixation determination unit determines that the three-way valve is in an intermediate fixation state in which the three flow passages simultaneously communicate with one another, when a cooling liquid temperature difference between one of the two flow passages that are controlled to (Continued)

communicate with each other, and a remaining flow passage of the three flow passages that is not controlled to communicate, is smaller than a predetermined value.

10 Claims, 8 Drawing Sheets

(51) Int. Cl.
| | | |
|---|---|---|
| H01M 10/63 | (2014.01) | |
| H01M 10/6568 | (2014.01) | |
| F28F 27/02 | (2006.01) | |
| F16K 37/00 | (2006.01) | |
| F01P 11/16 | (2006.01) | |
| B60L 3/00 | (2019.01) | |
| H05K 7/20 | (2006.01) | |
| B60K 11/04 | (2006.01) | |
| H01M 10/6567 | (2014.01) | |
| B60K 6/22 | (2007.10) | |
| H01M 10/625 | (2014.01) | |
| H01M 10/44 | (2006.01) | |

(52) U.S. Cl.
CPC ............ *F28F 27/02* (2013.01); *H01M 10/443* (2013.01); *H01M 10/613* (2015.04); *H01M 10/625* (2015.04); *H01M 10/63* (2015.04); *H01M 10/6567* (2015.04); *H01M 10/6568* (2015.04); *H05K 7/20272* (2013.01); *H05K 7/20927* (2013.01); *H05K 7/20945* (2013.01); *B60L 2210/10* (2013.01); *B60Y 2200/91* (2013.01); *B60Y 2200/92* (2013.01); *F01P 11/16* (2013.01); *F16K 37/0091* (2013.01)

(58) Field of Classification Search
CPC .............. H01M 10/63; H01M 10/6568; H05K 7/20927; H05K 7/20945; B60K 6/22
USPC ........ 236/34.5; 165/289, 297–298; 73/405 R
See application file for complete search history.

(56) References Cited

U.S. PATENT DOCUMENTS

| | | | | |
|---|---|---|---|---|
| 7,775,268 | B2* | 8/2010 | Sato | B60H 1/00892 123/41.1 |
| 8,161,800 | B2* | 4/2012 | Summers | F04B 27/0451 418/2 |
| 8,479,569 | B2* | 7/2013 | Sugimoto | F01P 7/164 73/114.68 |
| 2006/0196634 | A1* | 9/2006 | Sato | B60H 1/00885 165/41 |
| 2007/0068225 | A1* | 3/2007 | Brown | F16K 37/0075 73/40.5 A |
| 2007/0175414 | A1* | 8/2007 | Miyahara | F01P 11/16 123/41.1 |
| 2010/0305883 | A1* | 12/2010 | Danzy | F16K 17/04 702/50 |
| 2012/0137992 | A1* | 6/2012 | Kinomuka | F01P 7/165 123/41.08 |
| 2013/0213600 | A1* | 8/2013 | Saitoh | F01P 7/165 165/11.1 |
| 2013/0255605 | A1* | 10/2013 | Jentz | F01P 11/16 123/41.15 |
| 2014/0110081 | A1* | 4/2014 | Porras | F01P 11/04 165/11.1 |
| 2015/0107345 | A1* | 4/2015 | Sugimoto | F01P 11/16 73/114.68 |
| 2016/0061091 | A1* | 3/2016 | Hosokawa | F01P 7/164 123/41.09 |
| 2016/0102601 | A1* | 4/2016 | Hosokawa | F01P 7/14 123/41.08 |
| 2016/0109890 | A1* | 4/2016 | Styron | F01P 7/16 236/34.5 |
| 2016/0281586 | A1* | 9/2016 | Hosokawa | F01P 11/16 |

FOREIGN PATENT DOCUMENTS

| | | |
|---|---|---|
| JP | 2004-197713 A | 7/2004 |
| JP | 3777776 B2 | 5/2006 |
| JP | 4045894 B2 | 2/2008 |
| JP | 2012-117378 A | 6/2012 |
| JP | 2013-047473 A | 3/2013 |
| JP | 2013-194643 A | 9/2013 |

OTHER PUBLICATIONS

Jan. 17, 2017, International Search Opinion issued for related JP application No. PCT/JP2016/082880.

Apr. 24, 2019, Chinese Office Action issued for related CN Application No. 201680069994.X.

* cited by examiner

<BYPASS FLOW PASSAGE OPEN INSTRUCTION>
(FIRST ONE-SIDE FIXATION STATE)

<BYPASS FLOW PASSAGE OPEN INSTRUCTION>
(FIRST ONE-SIDE FIXATION STATE)

<MAIN FLOW PASSAGE OPEN INSTRUCTION>
(NORMAL STATE)

<MAIN FLOW PASSAGE OPEN INSTRUCTION>
(NORMAL STATE)

<MAIN FLOW PASSAGE OPEN INSTRUCTION>
(SECOND ONE-SIDE FIXATION STATE)

<MAIN FLOW PASSAGE OPEN INSTRUCTION>
(SECOND ONE-SIDE FIXATION STATE)

(INTERMEDIATE FIXATION STATE)

(INTERMEDIATE FIXATION STATE)

COOLING APPARATUS CAPABLE OF DETERMINING VALVE MALFUNCTION

CROSS REFERENCE TO PRIOR APPLICATION

This application is a National Stage Patent Application of PCT International Patent Application No. PCT/JP2016/082880 (filed on Nov. 4, 2016) under 35 U.S.C. § 371, which claims priority to Japanese Patent Application No. 2015-236713 (filed on Dec. 3, 2015), which are all hereby incorporated by reference in their entirety.

TECHNICAL FIELD

The present invention relates to a cooling apparatus including a cooling circuit provided with a three-way valve.

BACKGROUND ART

In order to prevent an abnormal temperature rise of a device to be cooled due to malfunction of a valve provided in a cooling circuit through which a cooling liquid circulates, a technique for determining malfunction of a valve is known from the related art. For example, techniques are disclosed in Patent Literatures 1 to 4 in which cooling liquid temperatures of an upstream-side flow passage and a downstream-side flow passage of a valve are acquired and the malfunction of the valve is determined based on a difference in temperature between the flow passages.

As a valve, a three-way valve is known which is disposed at an intersection point of three flow passages of a cooling circuit through which a cooling liquid circulates and is switchable such that any two of three flow passages communicate with each other.

PRIOR ART LITERATURE

Patent Literature

Patent literature 1: Japanese Patent No. 4045894
Patent Literature 2: Japanese Patent No. 3777776
Patent Literature 3: JP-A-2013-47473
Patent Literature 4: JP-A-2012-117378

SUMMARY OF THE INVENTION

Problem that the Invention is to Solve

By the way, examples of malfunction of the three-way valve include malfunction (hereinafter, referred appropriately to as a one-side fixation state) in which when switching between a first communication state, where a first flow passage and a second flow passage of first to third flow passages intersecting at an intersection point communicate with each other, and a second communication state, where the first flow passage and the third flow passage communicate with each other, is performed, the first communication state or the second communication state is maintained regardless of ON/OFF (energization/non-energization) of an electromagnetic portion and malfunction (hereinafter, referred appropriately to as an intermediate fixation state) in which three flow passages simultaneously communicate with one another, but only the one-side fixation state has been determined in the malfunction determination of the three-way valve so far and the intermediate fixation state has been out of the determination subject.

The present invention provides a cooling apparatus capable of determining the intermediate fixation state of the three-way valve.

Means for Solving the Problem

The present invention is to provide the following aspects.

A first aspect defines a cooling apparatus (e.g., a cooling apparatus 1 in an embodiment to be described below) including:

a cooling circuit (e.g., a cooling circuit 100 in the embodiment to be described below) that includes three flow passages (e.g., an inflow-side flow passage 108, a main cooling flow passage 101, and a bypass flow passage 107 in the embodiment to be described below) intersecting at an intersection point and allows a cooling liquid to circulate therethrough;

a three-way valve (e.g., a three-way valve 8 in the embodiment to be described below) that is disposed at the intersection point and is switchable such that any two of the three flow passages communicate with each other; and a controller (e.g., a controller 9 in the embodiment to be described below) that controls switching of the three-way valve, wherein the controller includes an intermediate fixation determination unit (e.g., an intermediate fixation determination portion 9c in the embodiment to be described below), and the intermediate fixation determination unit determines that the three-way valve is in an intermediate fixation state in which the three flow passages simultaneously communicate with one another, when a cooling liquid temperature difference between one of the two flow passages that are controlled to communicate with each other, and a remaining flow passage of the three flow passages that is not controlled to communicate, is smaller than a predetermined value.

A second aspect defines, based on the first aspect, the cooling apparatus, further including:

three temperature acquiring units (e.g. temperature sensors S1 to S3 in the embodiment to be described below) that respectively acquire cooling liquid temperatures of the three flow passages, wherein the intermediate fixation determination unit determines that the intermediate fixation state is established when a difference between a cooling liquid temperature acquired by any one of the temperature acquiring units provided in the two flow passages that are controlled to communicate with each other, and a cooling liquid temperature acquired by the temperature acquiring unit provided in the remaining flow passage of the three flow passages that is not controlled to communicate, is smaller than the predetermined value.

A third aspect defines, based on the first or second aspect, the cooling apparatus, wherein the three-way valve is disposed at a branch point (e.g., a branch point 105 in the embodiment to be described below) where an inflow-side flow passage (e.g., an inflow-side flow passage 108 in the embodiment to be described below), a first outflow-side flow passage (e.g., a main cooling flow passage 101 in the embodiment to be described below), and a second outflow-side flow passage (e.g., a bypass flow passage 107 in the embodiment to be described below) intersect with each other, the controller switches the three-way valve to a first outflow-side flow passage open state (e.g., a main flow passage release state in the embodiment to be described below) in which all a cooling liquid flowing in from the inflow-side flow passage flows out from the first outflow-side flow passage and to a second outflow-side flow passage open state (e.g., a bypass flow passage release state in the embodiment to be described below) in which all the cooling liquid flowing in from the inflow-side flow passage flows out from the second outflow-side flow passage, the three temperature acquiring units includes
an inflow-side temperature acquiring unit (e.g., a first temperature sensor S1 in the embodiment to be described below) that acquires a cooling liquid temperature of the inflow-side flow passage,
a first outflow-side temperature acquiring unit (e.g., a second temperature sensor S2 in the embodiment to be described below) that acquires a cooling liquid temperature of the first outflow-side flow passage, and
a second outflow-side temperature acquiring unit (e.g., a third temperature sensor S3 in the embodiment to be described below) that acquires a cooling liquid temperature of the second outflow-side flow passage,
the intermediate fixation determination unit determines, in the first outflow-side flow passage open state, that the intermediate fixation state is established when a difference between any one of the cooling liquid temperature acquired by the inflow-side temperature acquiring unit and the cooling liquid temperature acquired by the first outflow-side temperature acquiring unit, and the cooling liquid temperature acquired by the second outflow-side temperature acquiring unit, is smaller than the predetermined value, and
the intermediate fixation determination unit determines, in the second outflow-side flow passage open state, that the intermediate fixation state is established when a difference between any one of the cooling liquid temperature acquired by the inflow-side temperature acquiring unit and the cooling liquid temperature acquired by the second outflow-side temperature acquiring unit, and the cooling liquid temperature acquired by the first outflow-side temperature acquiring unit, is smaller than the predetermined value.

A fourth aspect defines, based on the third aspect, the cooling apparatus, wherein
the controller includes:
a first one-side fixation determination unit (e.g., a first one-side fixation determination portion 9a in the embodiment to be described below), which determines that the three-way valve is in a first one-side fixation state of being unable to operate in the first outflow-side flow passage open state when a difference in the cooling liquid temperature between the inflow-side flow passage and the second outflow-side flow passage is larger than h predetermined value even though the second outflow-side flow passage open state is instructed to the three-way valve; and
a second one-side fixation determination unit (e.g., a second one-side fixation determination portion 9h in the embodiment to be described below), which determines that the three-way valve is in a second one-side fixation state of being unable to operate in the second outflow-side flow passage open state when a difference in the cooling liquid temperature between the inflow-side flow passage and the first outflow-side flow passage is larger than the predetermined value even though the first outflow-side flow passage open state is instructed to the three-way valve.

A fifth aspect defines, based on the fourth aspect, the cooling apparatus, wherein
the intermediate fixation determination unit determines whether the intermediate fixation state is established after the first one-side fixation determination unit or the second one-side fixation determination unit determines that the three-way valve is not in the first one-side fixation state or the second one-side fixation state.

A sixth aspect defines, based on any one of the third to fifth aspects, the cooling apparatus, wherein
the inflow-side flow passage is connected to a radiator (e.g., a radiator 5 in the embodiment to be described below),
the first outflow-side flow passage is a storage battery cooling flow passage used to cool a storage battery (e.g., a storage battery 2 in the embodiment to be described below), and
the second outflow-side flow passage is a bypass flow passage that is guided to the radiator by bypassing the storage battery cooling flow passage.

A seventh aspect defines, based on the sixth aspect, the cooling apparatus, wherein
a cooling liquid flowing out from the storage battery cooling flow passage and the bypass flow passage is guided to the radiator through a high-temperature heat element cooling flow passage (e.g., a high-temperature heat element cooling flow passage 102 in the embodiment to be described below) used to cool a high-temperature heat element (e.g., a charger 3 and a DC-DC converter 4 in the embodiment to be described below).

An eighth aspect defines, based on the seventh aspect, the cooling apparatus, wherein
the high-temperature heat element is a charger (e.g., a charger 3 in the embodiment to be described below).

A ninth aspect defines, based on the eighth aspect, the cooling apparatus, wherein
the controller controls the three-way valve to be in the second outflow-side flow passage open state during charging of the storage battery, and
the intermediate fixation determination unit determines whether the intermediate fixation state is established during the charging of the storage battery.

A tenth aspect defines, based on any one of the first to ninth aspects, the cooling apparatus, wherein
the intermediate fixation determination unit determines whether the intermediate fixation state is established after the cooling liquid circulates through the cooling circuit for a predetermined time or more.

An eleventh aspect defines, based on any one of the first to tenth aspects, the cooling apparatus, wherein
the controller includes a notification unit (e.g., a notification portion 9d in the embodiment to be described below) that notifies a driver when the intermediate fixation determination unit determines that the intermediate state is established.

Advantage of the Invention

According to the first aspect, it is possible to determine the intermediate fixation state of the three-way valve, which has not been determined so far, based on the cooling liquid temperature difference between one flow passage of the two flow passages that is controlled to communicate with each other and the remaining flow passage that is not controlled to communicate with each other among the three flow passages.

According to the second aspect, since the cooling apparatus includes the three temperature acquiring units that respectively acquire the cooling liquid temperatures of the three flow passages, the intermediate fixation state of the three-way valve can be accurately determined.

According to the third aspect, it is possible to determine the intermediate fixation state of the three-way valve in the first outflow-side flow passage open state and the second outflow-side flow passage open state.

According to the fourth aspect, it is also possible to the one-side fixation state in addition to the intermediate fixation state of the three-way valve.

According to the fifth aspect, since the cooling apparatus determines the intermediate fixation state on the premise that one-side fixation state is not established, it is possible to accurately determine the intermediate fixation state.

According to the sixth aspect, it is possible to determine the intermediate fixation state of the three-way valve, while efficiently cooling the storage battery based on the switching control of the three-way valve according to the situation.

According to the seventh aspect, it is possible to determine the intermediate fixation state of the three-way valve, while efficiently cooling the storage battery and the high-temperature heat element based on the switching control of the three-way valve according to the situation.

According to the eighth aspect, it is possible to determine the intermediate fixation state of the three-way valve, while efficiently cooling the storage battery and the charger based on the switching control of the three-way valve according to the situation.

According to the ninth aspect, since the intermediate fixation state of the three-way valve is determined during the charging of the storage battery in which temperature difference between the inflow-side flow passage or the bypass flow passage and the storage battery cooling flow passage is large, it is possible to improve the determination precision of the intermediate fixation state.

According to the tenth aspect, since the intermediate fixation state is determined after the cooling liquid circulates the cooling circuit for a predetermined period of time or more, it is possible to prevent erroneous determination in a state in which the cooling liquid temperature is unstable.

According to the eleventh aspect, the driver can easily recognize the intermediate fixation state of the three-way valve.

BRIEF DESCRIPTION OF DRAWINGS

FIG. 3A is an explanatory view illustrating a flow of a cooling liquid, and FIG. 3B is an explanatory view illustrating a detection temperature of a first temperature sensor and a detection temperature of a third temperature sensor.

FIG. 4A is an explanatory view illustrating a flow of a cooling liquid, and FIG. 4B is an explanatory view illustrating a detection temperature of a first temperature sensor and a detection temperature of a third temperature sensor.

FIG. 5A is an explanatory view illustrating a flow of a cooling liquid, and FIG. 5B is an explanatory view illustrating a detection temperature of a first temperature sensor and a detection temperature of a second temperature sensor.

FIG. 6A is an explanatory view illustrating a flow of a cooling liquid, and FIG. 6B is an explanatory view illustrating a detection temperature of a first temperature sensor and a detection temperature of a second temperature sensor.

FIG. 7A is an explanatory view illustrating a flow of a cooling liquid, and FIG. 7B is an explanatory view illustrating a detection temperature of a first temperature sensor, a detection temperature of a second temperature sensor, and a detection temperature of a temperature sensor.

MODE FOR CARRYING OUT THE INVENTION

Hereinafter, an embodiment of a cooling apparatus of the present invention will be described based on the accompanying drawings. The drawings are seen in the direction of signs.

[Cooling Apparatus]

Figure 1:
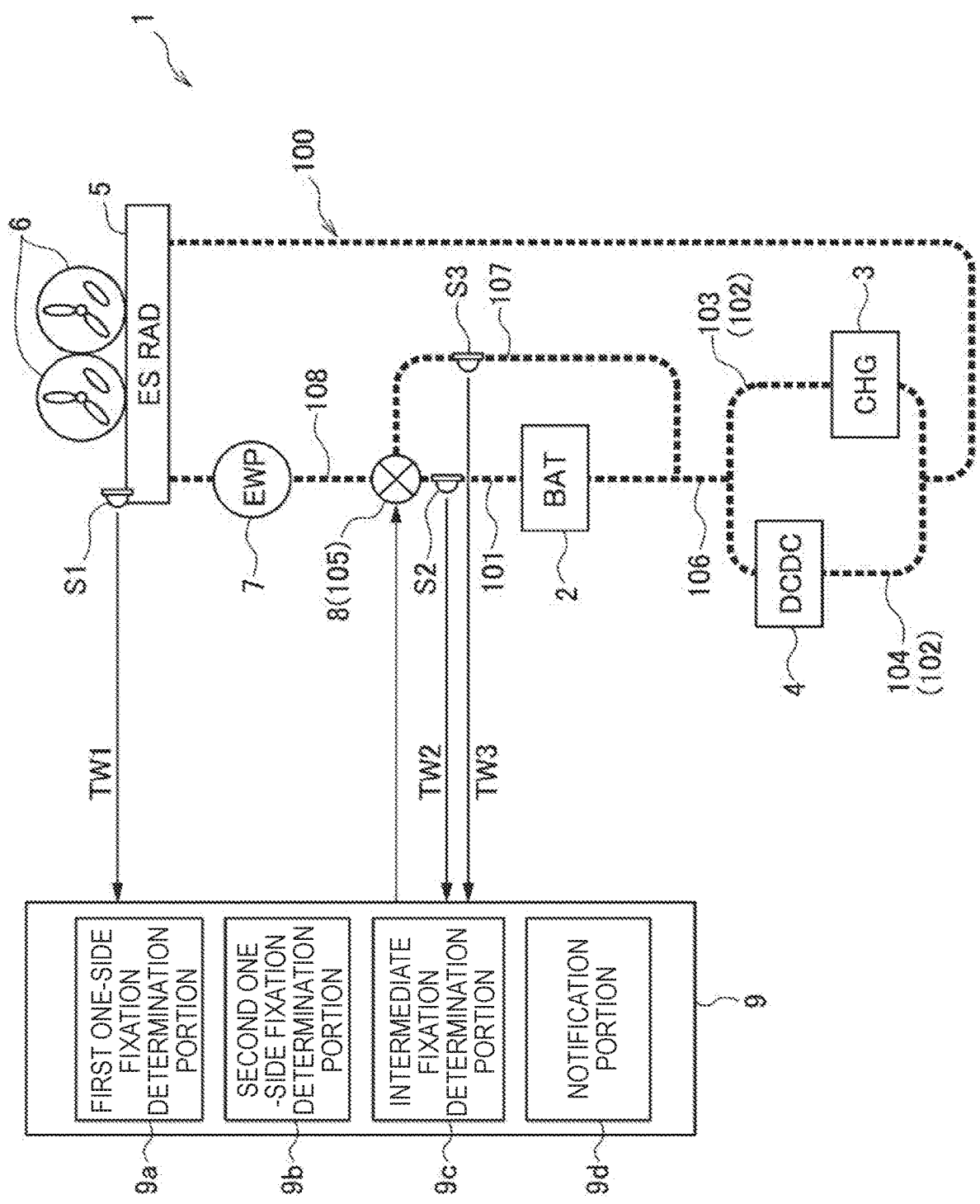
FIG. 1 is a block diagram illustrating a configuration of a cooling apparatus according to an embodiment of the present invention.

As illustrated in FIG. 1, a cooling apparatus 1 according to the embodiment of the present invention is configured to include a cooling circuit 100 which cools a storage battery 2, charger 3 and a DC-DC converter 4; a radiator 5, a cooling fan 6, a cooling pump 7 and a three-way valve 8 provided in the cooling circuit 100; and a controller which controls the cooling fan 6, the cooling pump 7 and the three-way valve 8, and the cooling apparatus 1 is mounted on a vehicle such as a hybrid vehicle, an electric vehicle, and a fuel cell vehicle.

The storage battery 2 is a high voltage battery which drives a running motor of the vehicle, the charger 3 charges the storage battery 2 with the electric power supplied from an external power supply, and the DC-DC converter 4 transforms the DC voltage. The charger 3 and the DC-DC converter 4 have higher heat resistance than the storage battery 2, and a high management temperature is set. For example, when the upper limit temperature of the storage battery 2 is set to 60° C., the upper limit temperatures of the charger 3 and the DC-DC converter 4 are set to 80° C., and it is necessary to preferentially cool the storage battery 2 under a high-temperature environment. On the other hand, at the time of charging or the like, since the charger 3 becomes a high-temperature, there is a case where it is desired to cool the charger 3 and the DC-DC converter 4, even if it is unnecessary to cool the storage battery 2.

[Cooling Circuit]

As illustrated in FIG. 1, the cooling circuit 100 includes a radiator 5, a cooling pump 7, a main cooling flow passage 101, and a high-temperature heat element cooling flow passage 102 arranged in series in a circulation flow passage through which a cooling liquid is circulated. The high-temperature heat element cooling flow passage 102 is configured such that a charger cooling flow passage 103 and a DC-DC converter cooling flow passage 104 are connected in parallel, and is connected to a downstream side of the main cooling flow passage 101.

The cooling circuit 100 includes a branch point 105 that branches the flow passage on the downstream side of the cooling pump 7 and on the upstream side of the main cooling flow passage 101, and a convergence point 106 that converges the flow passage on the downstream side of the main cooling flow passage 101 and on the upstream side of the high-temperature heat element cooling flow passage 102. The branch point 105 and the convergence point 106 are connected to each other via a bypass flow passage 107 which bypasses the main cooling flow passage 101.

The branch point 105 is an alternate current point among an inflow-side flow passage 108 connected to the cooling pump 7, the main cooling flow passage 101 serving as a first outflow-side flow passage, and the bypass flow passage 107 serving as a second outflow-side flow passage, and an electromagnetic three-way valve 8 is provided in the branch point 105. The three-way valve 8 performs switching of the flow passage so as to allow the inflow-side flow passage 108 and the main cooling flow passage 101 to communicate with each other at the time of turning-off of an electromagnetic portion 8a (see FIG. 2) to be described later is turned off. Further, the three-way valve 8 performs switching of the flow passage so as to allow the inflow-side flow passage 108 and the bypass flow passage 107 to communicate with each other at the time of turning-on of the electromagnetic portion 8a.

In the cooling circuit 100 configured as described above, when the cooling pump 7 is driven, the cooling pump 7 sucks the low-temperature cooling liquid from the radiator 5 side and discharges inflow-side toward the three-way valve 8. In a normal state, since the three-way valve 8 is turned off, the cooling liquid discharged from the cooling pump 7 does not flow to the bypass flow passage 107, and the whole amount thereof is supplied to the main cooling flow passage 101.

The cooling liquid supplied to the main cooling flow passage 101 cools the storage battery 2 and then flows into the high-temperature heat element cooling flow passage 102. The cooling liquid that has flowed into the high-temperature heat element cooling flow passage 102 is branched into the charger cooling flow passage 103 and the DC-DC converter cooling flow passage 104 to cool the charger 3 and the DC-DC converter 4. After the cooling liquid cools the charger 3 and the DC-DC converter 4, the cooling liquid returns to the radiator 5 after convergence and is cooled here.

On the other hand, in the cooling circuit 100, in a case where it is necessary to cool the charger 3 and the DC-DC converter 4 in a situation in which cooling of the storage battery 2 is not required or in a situation in which the cooling liquid temperature is not appropriate for the required temperature of the storage battery 2 (for example, when the storage battery 2 is charged), by controlling the electromagnetic portion 8a of the three-way valve 8, the supply of the cooling liquid to the main cooling flow passage 101 is shut off, and it is possible to supply the cooling liquid to the charger cooling circuit 103 and the DC-DC converter cooling flow passage 104 via the bypass flow passage 107. The cooling liquid after cooling the charger 3 and the DC-DC converter 4 returns to the radiator 5 after convergence and is cooled here.

[Temperature Acquiring Unit]

The cooling circuit 100 is provided with three temperature acquiring units. The three temperature acquiring units includes an inflow-side temperature acquiring unit for acquiring the cooling liquid temperature of the inflow-side flow passage of the three-way valve 8, a first outflow-side temperature acquiring unit for acquiring the cooling liquid temperature of a first outflow-side flow passage of the three-way valve 8, and a second outflow-side temperature acquiring unit for acquiring the cooling liquid temperature of a second outflow-side flow passage of the three-way valve 8. In this embodiment, a first temperature sensor S1 for detecting the temperature of the cooling liquid at the outlet of the radiator 5 is the inflow-side temperature acquiring unit, a second temperature sensor S2 for detecting the temperature of the cooling liquid in the main cooling flow passage 101 is the first outflow-side temperature acquiring unit, and a third temperature sensor S3 for detecting the temperature of the cooling liquid in the bypass passage 107 is the second outflow-side temperature acquiring unit. The temperature of the cooling liquid in each flow passage is not limited to the case of being directly detected by the temperature sensor, but may be acquired by being estimated from the temperature-related value.

[Three-Way Valve]

Figure 2:
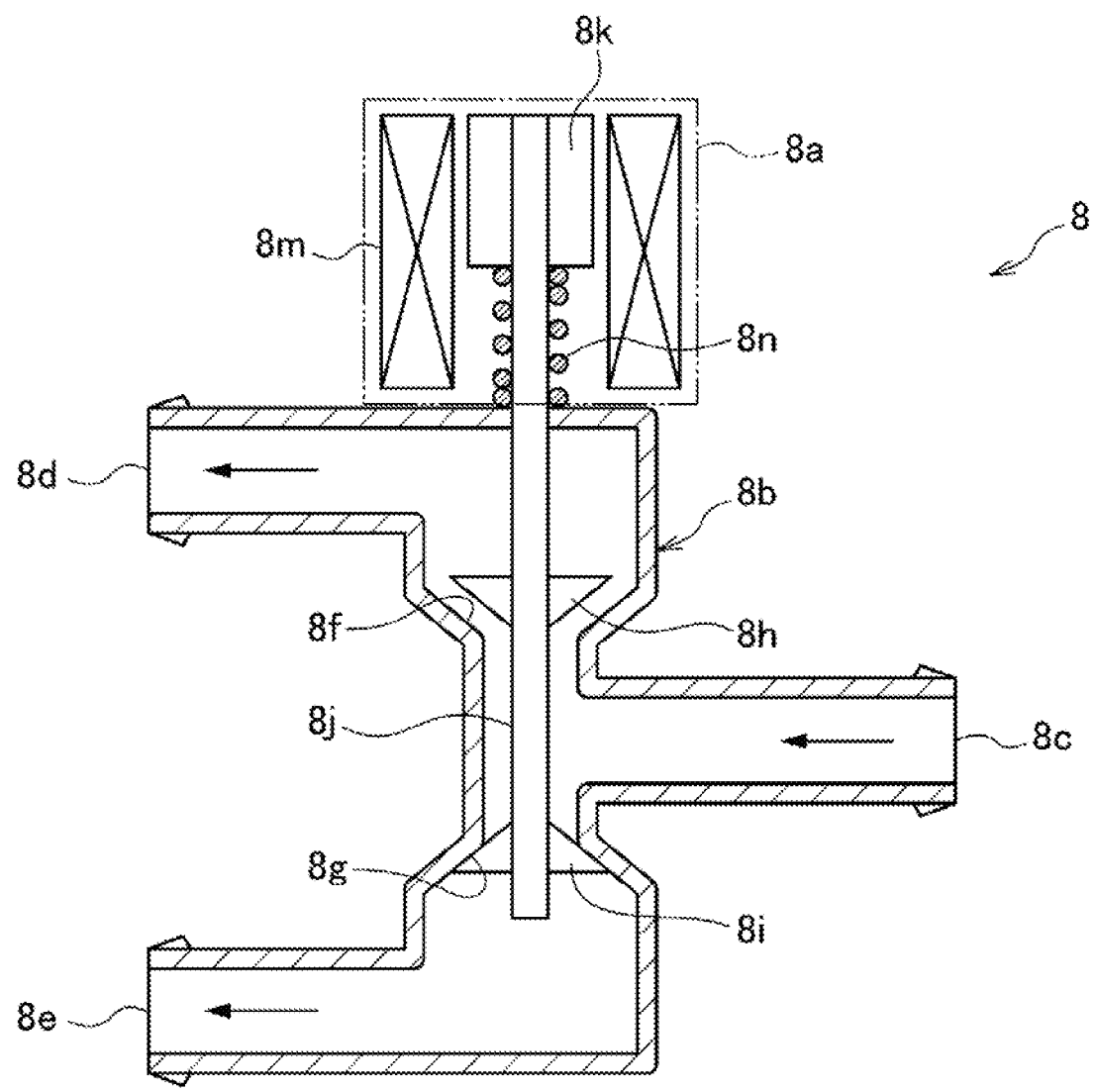
FIG. 2 is a schematic cross-sectional view of a three-way valve.

As illustrated in FIG. 2, the three-way valve 8 is configured to include an electromagnetic portion 8a and a valve portion 8b. The valve portion 8b has an inlet port 8c connected to the inflow-side flow passage 108, a first outlet port 8d connected to the main cooling flow passage 101, a second outflow port 8e connected to the bypass flow passage 107, a first communicating port 8f which allows the inflow port 8c to communicate with the first outflow port 8d, a second communicating port 8g which allows the inflow port 8c to communicate with the second outflow port 8e, a first cone 8h which opens and closes the first communicating port 8f, a second cone 8i which opens and closes the second communicating port 8g, and a lifting rod 8j which integrally holds the first cone 8h and the second cone 8i.

When the lifting rod 8j is raised, by opening the first communicating port 8f with the first cone 8h, and by closing the second communicating port 8g with the second cone 8i, the valve portion 8b allows the inflow port 8c to communicate with the first outlet port 8d (an open state of the main flow passage). When the lifting rod 8j is lowered, by closing the first communicating port 8f with the first cone 8h, and by opening the second communicating port 8g with the second cone 8i, the valve portion 8b allows the inflow port 8c to communicate with the second outflow port 8e (am open state of the bypass flow passage).

The electromagnetic portion 8a is a solenoid which electromagnetically raises and lowers the lifting rod 8j, and includes a core 8k provided at the upper end portion of the lifting rod 8j, an armature coil 8m which surrounds the core 8k, and a spring which urges the lifting rod 8j upward. In a turning-off state in which the armature coil 8m is not energized, since the lifting rod 8j is held upward by the urging force of the spring 8n, an open state of the main flow passage in which the inflow port 8c communicates with the first outflow port 8d is obtained. In a turning-on state in which the armature coil 8m is energized, since the core 8k is pulled downward by the magnetic field generated by the armature coil 8m and the lifting rod 8j is held downward, an open state of the bypass flow passage in which the inflow port 8c communicates with the second outflow port 8e is obtained.

There is a possibility that the three-way valve 8 configured as described above may fail due to biting of foreign matter or electric trouble. As malfunction of the three-way valve 8, in addition to a first one-side fixation state of maintaining the main flow passage open state and a second one-side fixation state of maintaining the bypass flow passage open state regardless of the turning on/off instruction of the electromagnetic part 8a, a first communicating port 8f and the second communicating port 8g are in a half open state and there is an intermediate fixed state in which the inflow port 8c, the first outflow port 8d, and the second outflow port 8e are allowed to communicate with each other at the same time. Hereinafter, a method of determining the three fixation states of the three-way valve 8 by the controller 9 will be described.

[Controller]

As illustrated in FIG. 1, the controller 9 includes a first one-side fixation determination portion 9a, a second one-side fixation determination portion 9b, an intermediate fixation determination portion 9c, and a notification portion 9d.

Figure 3A:
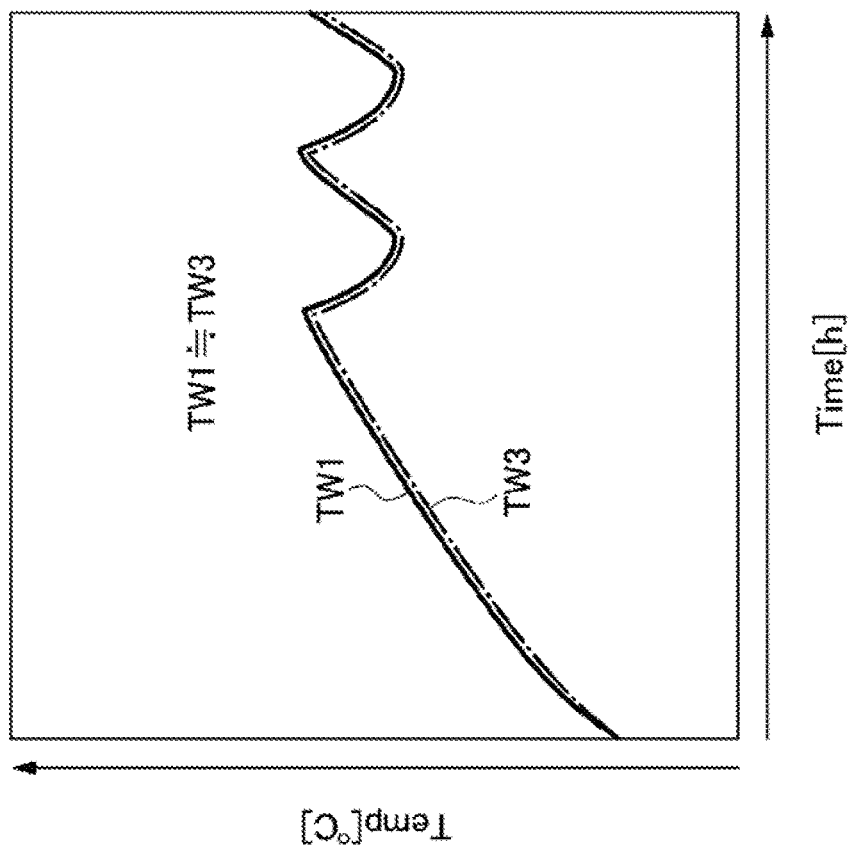
FIGS. 3A and 3B are explanatory views of a normal state of the three-way valve at the time of instructing to open a bypass flow passage.
Figure 3B:
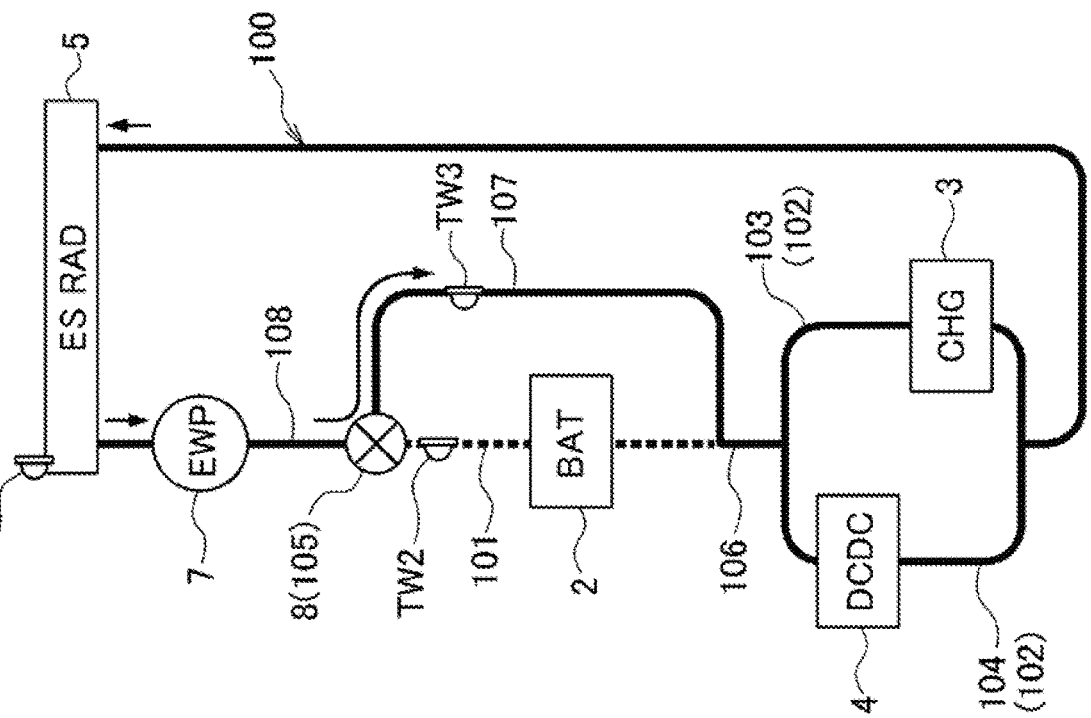
Figure 4A:
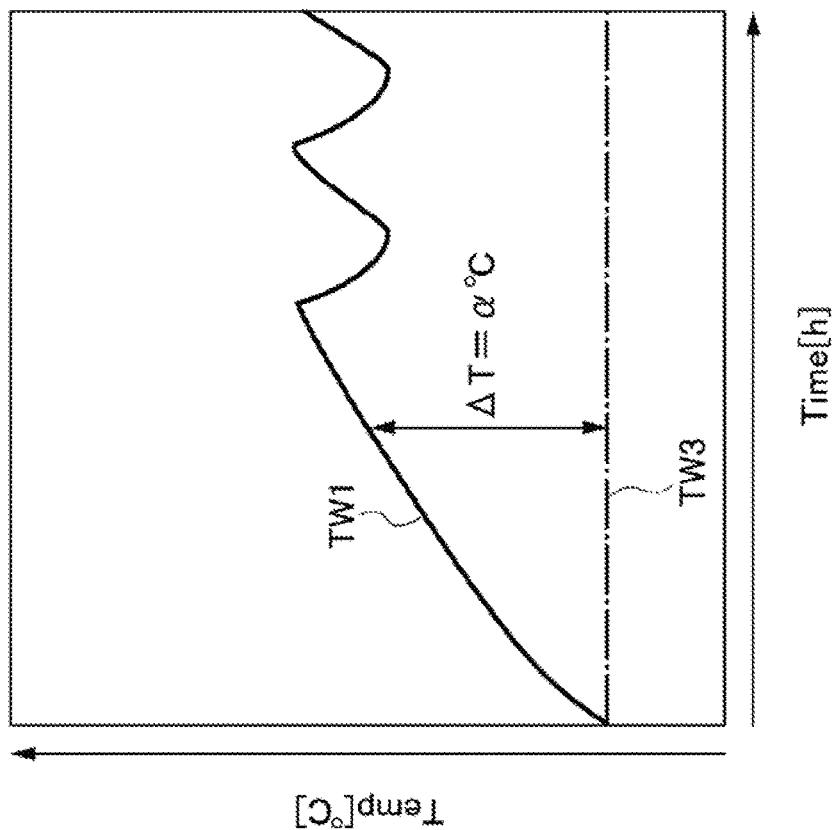
FIGS. 4A and 4B are explanatory views of a first one-side fixation state of the three-way valve at the time of instructing to open the bypass flow passage.
Figure 4B:
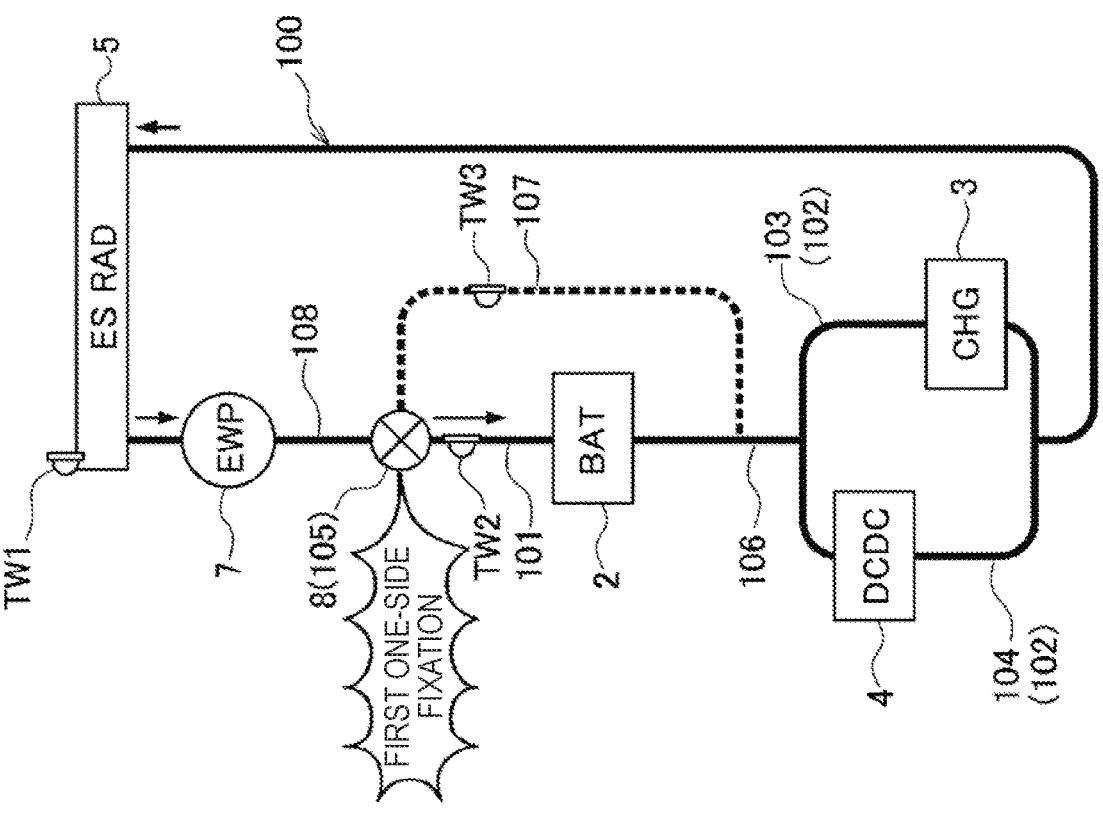

Even if the bypass flow passage open state is instructed to the three-way valve 8, when the three-way valve 8 maintains the main flow passage open state, the first one-side fixation determination portion 9a determines that the three-way valve 8 is in the first one-side fixation state. In the normal state, when instructing the bypass flow passage open state to the three-way valve 8, as illustrated in FIG. 3A, since the cooling liquid flows from the inflow-side flow passage 108 to the bypass flow passage 107, as illustrated in FIG. 3B, a detection temperature TW1 of the first temperature sensor S1 and a detection temperature TW3 of the third temperature sensor S3 should be substantially equal to each other. However, when the three-way valve 8 is in the first one-side fixation state, as illustrated in FIG. 4A, since the cooling liquid flows from the inflow-side flow passage 108 to the main cooling flow passage 101, as illustrated in FIG. 4B, a temperature difference ΔT between the detection temperature TW1 of the first temperature sensor S1 and the detection temperature TW3 of the third temperature sensor S3 increases. Therefore, when the temperature difference ΔT is larger than the predetermined value α° C. (for example, 9.0° C.), the first one-side fixation determination portion 9a can determine that the three-way valve 8 is in the first one-side fixation state.

Figure 5B:
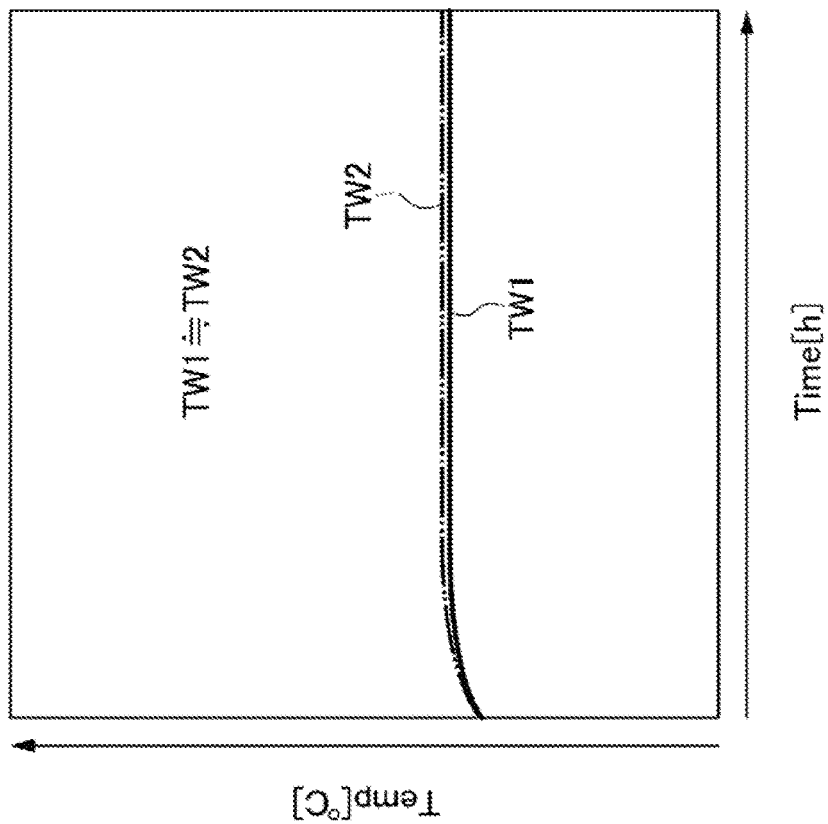
FIGS. 5A and 5B are explanatory views of a normal state of the three-way valve at the time of instructing to open a main flow passage.
Figure 5A:
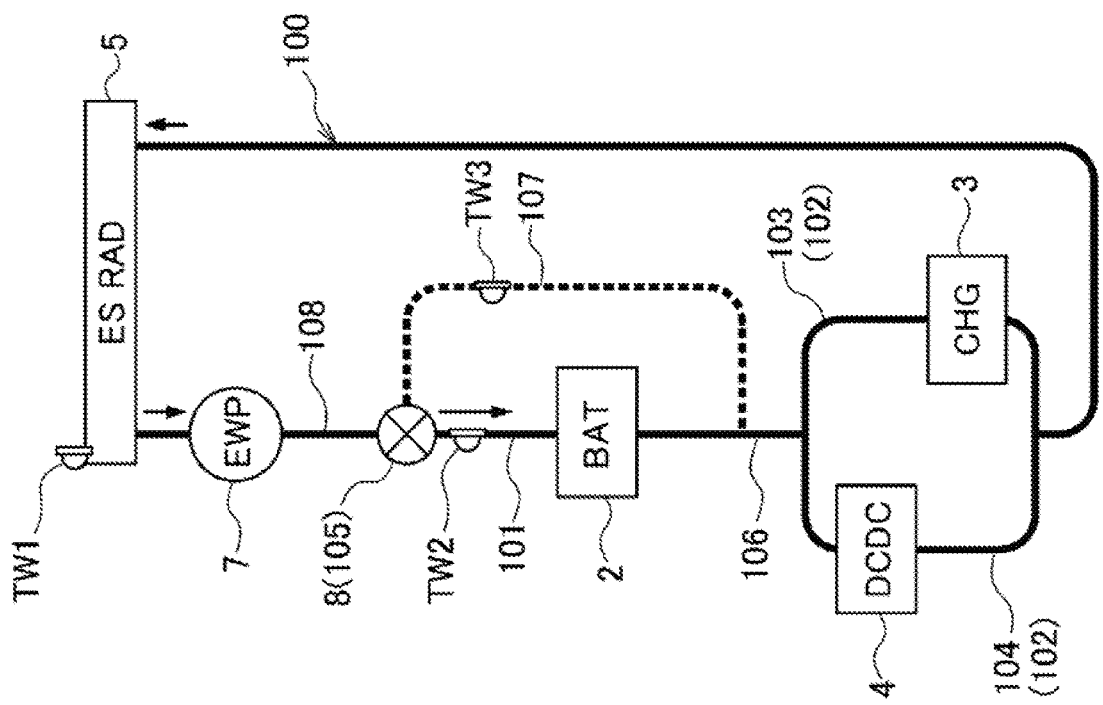
Figure 6A:
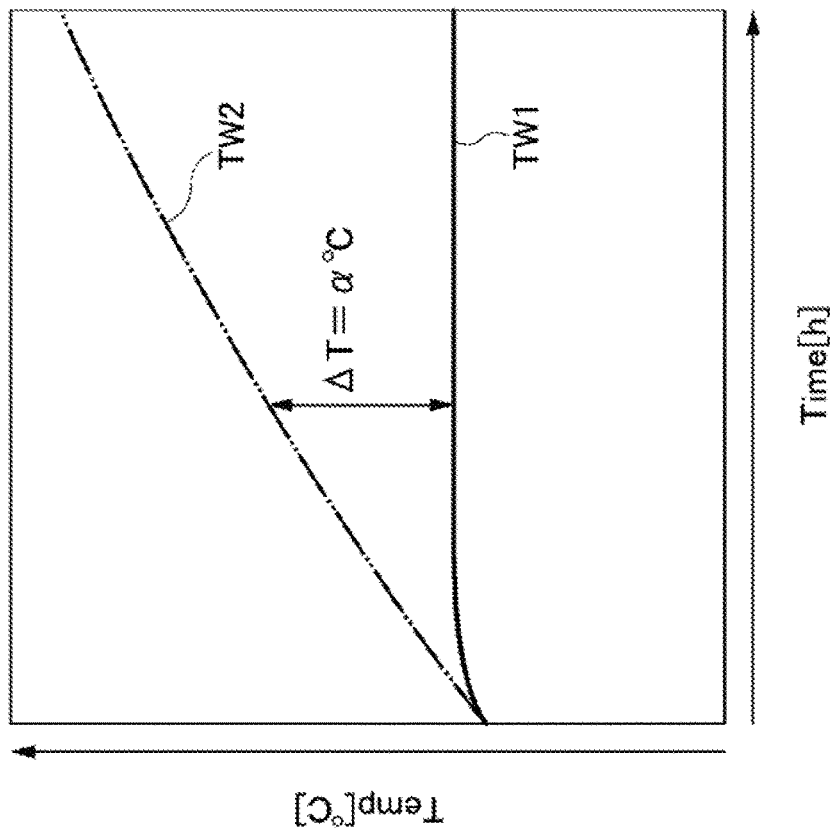
FIGS. 6A and 6B are explanatory views of a second one-side fixation state of the three-way valve at the time of instructing to open a main flow passage.
Figure 6B:
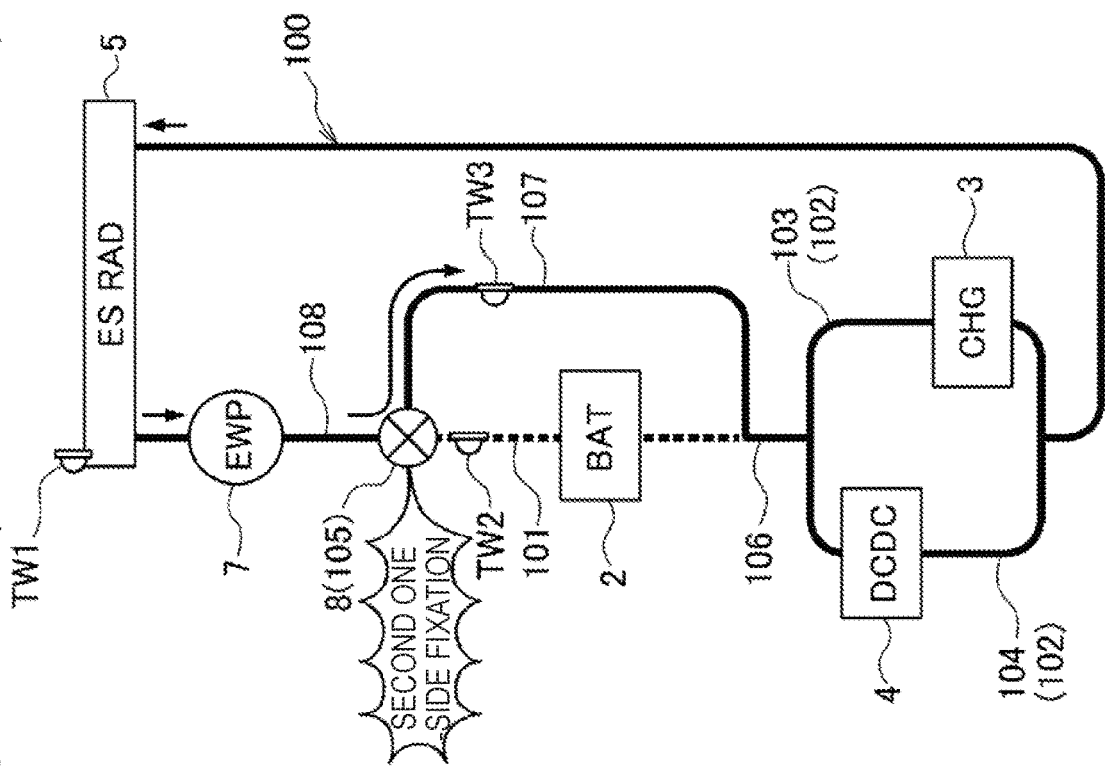

Even if the three-way valve 8 is instructed to the main flow passage open side, when the three-way valve 8 maintains the bypass flow passage open state, the second one-side fixation determination unit 9b determines that the three-way valve 8 is in the second one-side fixation state. In the normal state, when the main flow passage open state is instructed to the three-way valve 8, since the cooling liquid flows from the inflow-side flow passage 108 to the main cooling flow passage 101 as illustrated in FIG. 5A, the detection temperature TW1 of the first temperature sensor S1 and the detection temperature TW2 of the second temperature sensor S2 should substantially coincide with each other as illustrated in FIG. 5B. However, when the three-way valve 8 is in the second one-side fixation state, since the cooling liquid flows from the inflow-side flow passage 108 to the bypass flow passage 107 as illustrated in FIG. 6A, the temperature difference ΔT between the detection temperature TW1 of the first temperature sensor S1 and the detection temperature TW2 of the second temperature sensor S2 increases as illustrated in FIG. 6B. Therefore, when the temperature difference ΔT is larger than the predetermined value α° C. (for example, 9.0° C.), the second one-side fixation determination portion 9b can determine that the three-way valve 8 is in the second one-side fixation state.

Figure 7B:
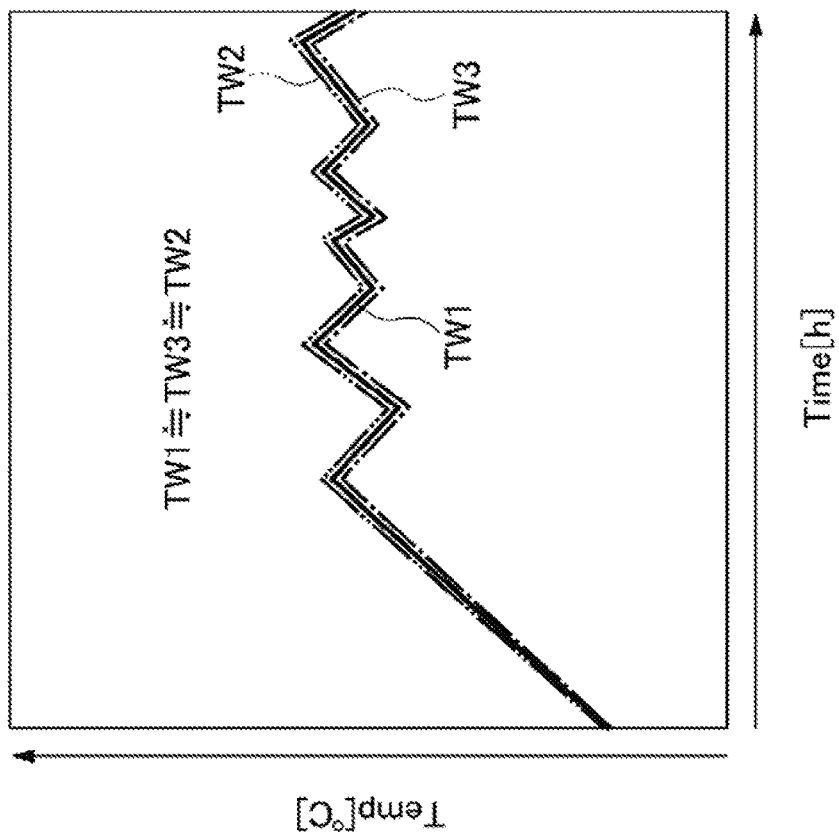
FIGS. 7A and 7B are explanatory views of an intermediate fixation state of the three-way valve.
Figure 7A:
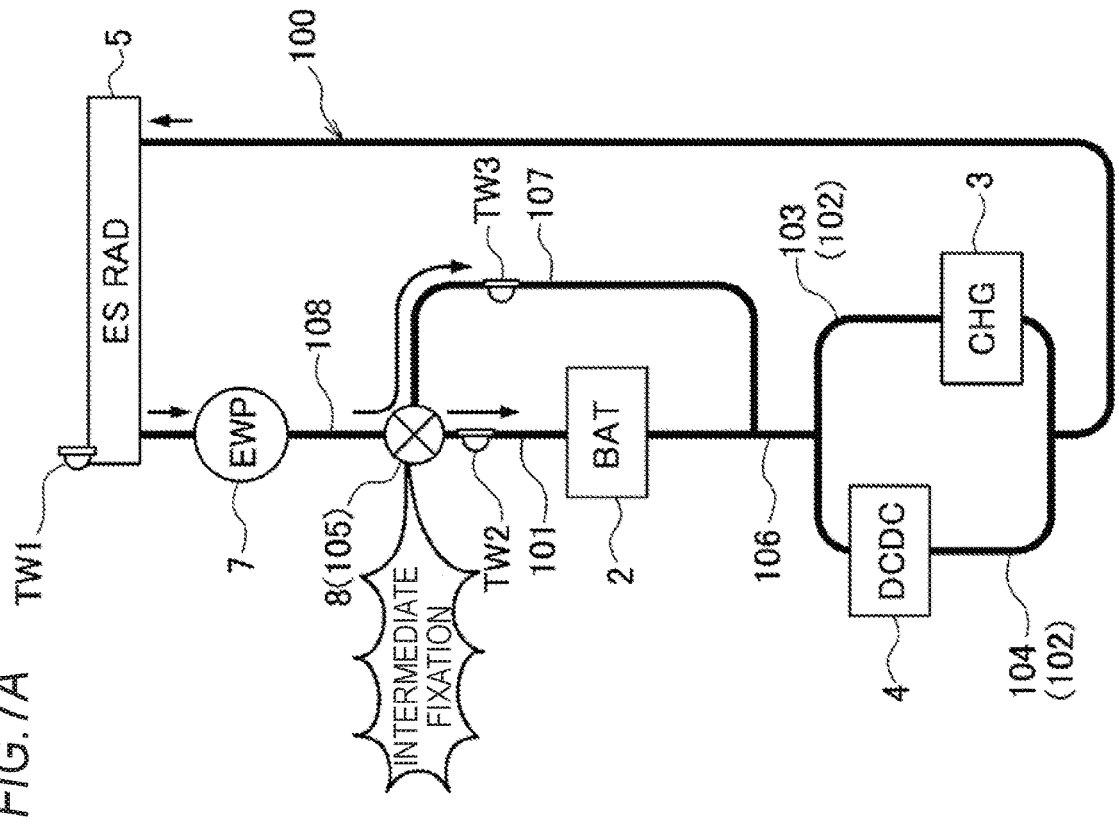

Even if the main flow passage open state or to the bypass flow passage open state is instructed to the three-way valve 8, as illustrated in FIG. 7A, when the cooling liquid flows out of the two outflow ports 8d and 8e of the three-way valve 8, the intermediate fixing determination portion 9c determines that the three-way valve 8 is in the intermediate fixed state. In the normal state, when the main flow passage open state is instructed to the three-way valve 8, as illustrated in FIG. 5A, the entire amount of cooling liquid flows from the inflow-side flow passage 108 to the main cooling flow passage 101, and the cooling liquid does not flow through the bypass flow passage 107. Thus, the temperature difference between the detection temperature TW1 of the first temperature sensor S1 and the detection temperature TW3 of the third temperature sensor S3 or the temperature difference between the detection temperature TW2 of the second temperature sensor S2 and the detection temperature TW3 of the third temperature sensor S3 should be large. However, when the three-way valve 8 is in the intermediate fixed state, as illustrated in FIG. 7B, since the cooling liquid also flows from the inflow-side flow passage 108 to the bypass flow passage 107, the detection temperature TW1 of the first temperature sensor S1 and the detection temperature TW3 of the third temperature sensor S3 substantially coincide with each other, or the detection temperature TW2 of the second temperature sensor S2 and the detection temperature TW3 of the third temperature sensor S3 substantially coincide with each other. Therefore, even though the main passage open state is instructed to the three-way valve 8, the intermediate fixing determination portion 9c can determine that the three-way valve 8 is in the intermediate fixed state, when the temperature difference ΔT between the detection temperature TW1 of the first temperature sensor S1 and the detection temperature TW3 of the third temperature sensor S3, or the temperature difference ΔT between the detection temperature TW2 of the second temperature sensor S2 and the detection temperature TW3 of the third temperature sensor S3 is smaller than a predetermined value β° C. (for example, 3.0° C.).

In the normal state, when the bypass flow passage open state is instructed to the three-way valve 8, as illustrated in FIG. 3A, the entire amount of the cooling liquid flows from the inflow-side flow passage 108 to the bypass flow passage 107, and the cooling liquid does not flow through the main cooling flow passage 101. Accordingly, the temperature difference between the detection temperature TW1 of the first temperature sensor S1 and the detection temperature TW2 of the second temperature sensor S2, or the difference between the detection temperature TW2 of the second temperature sensor S2 and the detection temperature TW3 of the third temperature sensor S3 should be large. However, when the three-way valve 8 is in the intermediate fixed state, since the cooling liquid also flows from the inflow-side flow passage 108 to the main cooling flow passage 101 as illustrated in FIG. 7B, the detection temperature TW1 of the first temperature sensor S1 and the detection temperature TW2 of the second temperature sensor S2 substantially coincides with each other, or the detection temperature TW2 of the second temperature sensor S2 and the detection temperature TW3 of the third temperature sensor S3 substantially coincides with each other. Therefore, although the bypass flow passage open state is instructed to the three-way valve 8, when the temperature difference ΔT between the detection temperature TW1 of the first temperature sensor S1 and the detection temperature TW2 of the second temperature sensor S2, or the temperature difference ΔT between the detection temperature TW2 of the second temperature sensor S2 and the detection temperature TW3 of the third temperature sensor S3 is smaller than a predetermined value β° C. (for example, 3.0° C.), the intermediate fixing determination portion 9c can determine that the intermediate fixing determination portion 9c determines that the three-way valve 8 is in the intermediate fixed state.

In the case where the three-way valve 8 is determined to be in the first one-side fixation state by the first one-side fixation determination portion 9a, in the case where the third side valve 8 is determined to be in the second one-side fixation state by the second one-side fixation determination portion 9b, and in the case where the three-way valve 8 is determined to be in the intermediate fixation state by the intermediate fixing determination portion 9c, the notification portion 9d reports these situations to the driver. For example, the notifying method may be displayed on the instrument panel or may generate an alarm sound.

[Malfunction Determination Procedure]

Next, referring to FIG. 8, a description will be given of a malfunction determination procedure of the controller 9 that achieves the determination of the fixing state as described above, in the malfunction determination illustrated in FIG. 8, determination of the intermediate fixation state is performed only in a situation (for example, when the storage battery 2 is charged) in which the bypass flow passage open state is instructed to the three-way valve 8. However, even in a situation in which the main flow passage open state is instructed to three-way valve 8, determination of the intermediate fixation state may be performed.

Figure 8:
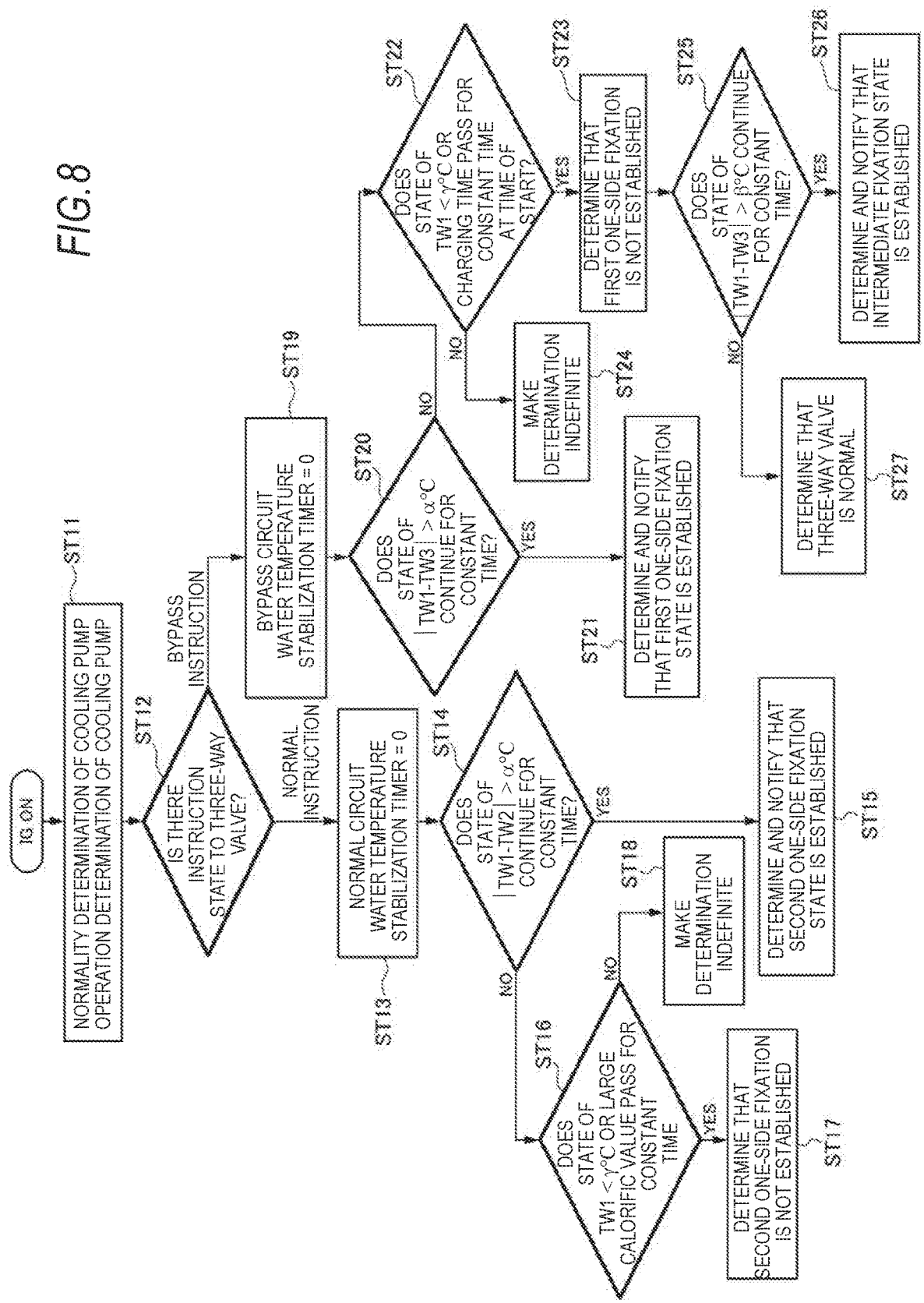
FIG. 8 is a flowchart illustrating a malfunction determination procedure of the three-way valve.

As illustrated in FIG. 8, the controller 9 starts the malfunction determination in accordance with the turning-on operation of an ignition switch (not illustrated). In the malfunction determination, first, the normality determination and the operation determination of the cooling pump 7 are performed (ST11), and thereafter, the instruction state to the three-way valve 8 is determined (ST12). If it is determined that there is an normal instruction state which instructs the main flow passage open state, elapse of a normal circuit water temperature stabilization timer time (for example, 8 minutes) is waited (ST13). Note that the time required for the cooling liquid temperature in the cooling circuit 100 to enter a stable state after the switching of the three-way valve 8 is set as the normal circuit cooling liquid temperature stabilization timer time.

After elapse of the normal circuit water temperature stabilization timer time, it is determined whether the temperature difference (absolute value) between the detection temperature TW1 of the first temperature sensor S1 and the detection temperature TW2 of the second temperature sensor S2 is greater than the predetermined value $\alpha°$ C. continues for a predetermined period of time (ST14). If the result of the determination is YES, that is, if a state in which the temperature difference (absolute value) between detection temperature TW1 of the first temperature sensor S1 and the detection temperature TW2 of the second temperature sensor S2 is greater than the predetermined value $\alpha°$ C. continues for a predetermined period of time, it is determined that there is a second one-side fixation state which maintains the bypass flow passage open state even when the main flow passage open state is instructed, and the driver is notified that the second one-side fixation state is established (ST15).

Further, if the result of the determination of step ST14 is NO, that is, if the temperature difference (absolute value) between the detection temperature TW1 of the first temperature sensor S1 and the detection temperature TW2 of the second temperature sensor S2 is greater than the predetermined value $\alpha°$ C., it is determined whether a state in which the detection temperature TW1 of the first temperature sensor S1 is lower than a predetermined value $\gamma°$ C. (for example, 50° C.) continues for a predetermined period of time (for example, 40 minutes) (ST16). This determination is intended to avoid erroneous normality determination of the three-way valve 8 in a state where the ambient temperature is high or in a state in which the calorific value of the storage battery 2 is large. When the result of the determination is YES, that is, when the detection temperature TW1 of the first temperature sensor S1 is lower than the predetermined value $\gamma°$ C. continues for a predetermined period of time, it is determined that the three-way valve 8 is not in the second one-side fixation state (ST17), and in the case of NO, that is, when the detection temperature TW1 of the temperature sensor S1 is lower than the predetermined value $\gamma°$ C. does not continue for a predetermined period of time, the determination is indefinite (ST18).

On the other hand, if it is determined in step ST12 that the instruction state to the three-way valve 8 is the bypass instruction state (at the time of charging of the storage battery 2) of instructing the bypass flow passage open state, the elapse of the bypass circuit water temperature stabilization timer time (for example, 8 minutes) maintained (ST19). At the bypass circuit water temperature stabilization timer time, a time required for the temperature of the cooling liquid in the cooling circuit 100 to be in a stable state after the switching of the three-way valve 8 is set.

It is determined whether the state in which the temperature difference (absolute value) between the detection temperature TW1 of the first temperature sensor S1 and the detection temperature TW3 of the third temperature sensor S3 is greater than the predetermined value $\alpha°$ C. continues for a predetermined period of time after the elapse of the bypass circuit water temperature stabilization timer time (ST20). If the result of the determination is YES, that is, if a state in which the temperature difference (absolute value) between the detection temperature TW1 of the first temperature sensor S1 and the detection temperature TW3 of the third temperature sensor S3 is greater than the predetermined value $\alpha°$ C. is longer continues for a predetermined period of time, it is determined that there is a the first one-side fixation state in which the main flow passage open state is maintained even if the bypass flow passage open state is instructed, and the first one-side fixation state is notified to the driver (ST21).

If the result of the determination in step ST20 is NO, that is, if a state in which the temperature difference (absolute value) between the detection temperature TW1 of the first temperature sensor S1 and the detection temperature TW3 of the third temperature sensor S3 is larger than the predetermined value $\alpha°$ C. does not continue for a predetermined period of time, it is determined whether or not a state in which the detection temperature TW1 of the first temperature sensor S1 is lower than a predetermined value $\gamma°$ C. (for example, 40° C.) continues for a predetermined period of time (for example, 30 minutes) (ST22). This determination is intended to avoid erroneous normality determination of the three-way valve 8 in a state in which the ambient temperature is high or in a state in which the calorific value of the charger 3 is large, and when the result of the determination is YES, that is, when the state in which the detection temperature TW1 of the temperature sensor S1 is lower than the predetermined value $\gamma°$ C. continues for a predetermined period of time, it is determined that the first one-side fixation state is not established (ST23), and in the case of NO, that is, when the state in which the detection temperature TW1 of the first temperature sensor S1 is lower than the predetermined value $\gamma°$ C. does not continue for a predetermined period of time, the determination is indefinite (ST24).

If it is determined that the three-way valve 8 is not in the first one-side fixation state, then it is determined whether the state in which the temperature difference (absolute value) between the detection temperature TW1 of the first temperature sensor S1 and the detection temperature TW2 of the second temperature sensor S2 is smaller than a predetermined value $\beta°$ C. continues for a predetermined period of time (ST25). If the result of the determination is YES, that is, if a state in which the temperature difference absolute value) between the detection temperature TW1 of the first temperature sensor S1 and the detection temperature TW2 of the second temperature sensor S2 is smaller than the predetermined value β° C. continues for a predetermined period of time, it is determined that there is an intermediate fixation state in which the cooling liquid flows from the inflow-side flow passage 108 to the main cooling flow passage 101 and the bypass flow passage 107, and the intermediate fixation state is notified to the driver (ST26). If the result of the determination of step ST25 is NO, that is, if the state in which the temperature difference (absolute value) between the detection temperature TW1 of the first temperature sensor S1 and the detection temperature TW2 of the second temperature sensor S2 is smaller than the predetermined value β° C. does not continue for a predetermined period of time, the three-way valve 8 is determined to be normal (ST27).

As described above, according to the cooling apparatus 1 of the present embodiment, it is possible to determine the intermediate fixation state of the three-way valve 8, which has not been determined so far, based on the cooling liquid temperature difference between one flow passage of the two flow passages controlled to communicate with each other and the remaining flow passage that is not controlled to communicate with each other among the three flow passages.

Since the cooling apparatus 1 of the present embodiment includes the three temperature sensors S1 to S3 that respectively acquire the cooling liquid temperatures of the three flow passages, the intermediate fixation state of the three-way valve 8 can be accurately determined.

Further, in the cooling apparatus 1 of the present embodiment, it is possible to determine not only the intermediate fixation state of the three-way valve 8 but also the first one-side fixation state and the second one-side fixation state of the three-way valve 8.

Further, since the cooling apparatus 1 of the present embodiment determines the intermediate fixation state on the premise that one-side fixation state is not established, it is possible to accurately determine the intermediate fixation state.

Further, in the cooling apparatus 1 of the present embodiment, since the three-way valve 8 performs switching between the main cooling flow passage 101 and the bypass flow passage 107, it is possible to determine the intermediate fixation state of the three-way valve 8, while efficiently cooling the storage battery 2 based on the switching control of the three-way valve 8 according to the situation.

In addition, in the cooling apparatus 1 of the present embodiment, since the cooling liquid flowing out of the main cooling flow passage 101 and the bypass flow passage 107 is guided to the radiator 5 via the high-temperature heat element cooling flow passage 102, it is possible to determine the intermediate fixation state of the three-way valve 8, while efficiently cooling the storage battery 2, the charger 3 and the DC-DC converter 4, based on the switching control of the valve 8 according to the situation.

In the cooling apparatus 1 of the present embodiment, since the intermediate fixation state of the three-way valve 8 is determined during the charging of the storage battery 2 in which temperature difference between the inflow-side flow passage 108 or the bypass flow passage 107 and the main cooling flow passage 101 is large, it is possible to improve the determination precision of the intermediate fixation state.

In the cooling apparatus 1 of the present embodiment, since the intermediate fixation state is determined after the cooling liquid circulates the cooling circuit 100 for a predetermined period of time or more, it is possible to prevent erroneous determination in a state in which the cooling liquid temperature is unstable.

In the cooling apparatus 1 of the present embodiment, since the intermediate fixation state of the three-way valve 8 is notified, the driver can easily recognize the intermediate fixation state of the three-way valve 8.

It is to be noted that the present invention is not limited to the above-described embodiment, but appropriate modification, improvement, and the like can be made.

For example, in the above-described embodiment, the storage battery, the charger, and the DC-DC converter are exemplified as the cooling target devices of the cooling apparatus, but the present invention is not limited thereto, and another high-voltage device such as an inverter may be used as the cooling target device. Also, any one of the cooling target devices may be used, or any combination of two or more may be used.

The cooling apparatus of the present invention can be applied not only to a water-cooling type which uses water as a cooling liquid, but also to an oil-cooled type which uses oil as a cooling liquid.

DESCRIPTION OF REFERENCE NUMERALS AND CHARACTERS 1 cooling apparatus
2 storage battery
3 charger
4 DC converter
5 radiator
8 three-way valve
9 controller
9a first one-side fixation determination portion (first one-side fixation determination unit)
9b second one-side fixation determination portion (second one-side fixation determination unit)
9c intermediate fixation determination portion (intermediate fixation determination unit)
9d notification portion (notification unit)
100 cooling circuit
101 main cooling flow passage
102 high-temperature heat element cooling flow passage
103 charger cooling flow passage
104 DC-DC converter cooling flow passage
105 branch point
107 bypass flow passage
108 inflow-side flow passage
S1 first temperature sensor (inflow-side temperature acquiring unit)
S2 second temperature sensor (first outflow-side temperature acquiring unit)
S3 third temperature sensor (second outflow-side temperature acquiring unit)

The invention claimed is:

1. A cooling apparatus comprising:
a cooling circuit that includes three flow passages, including an inflow-side flow passage, a first outflow-side flow passage that is a cooling flow passage configured to cool a cooling target device, and a second outflow-side flow passage that is a bypass flow passage configured to bypass the cooling target device, which intersect at an intersection point, and allows a cooling liquid to circulate therethrough;
a three-way valve that is disposed at the intersection point and is switchable between a first operable state in which the inflow-side flow passage fluidly communicates with the first outflow-side flow passage via an inlet port and a first outlet port while the inflow-side flow passage and the second outflow-side passage are not in fluid communication with each other, and a second operable state in which the inflow-side flow passage fluidly communicates with the second outflow-side flow passage via the inlet port and a second outlet port, while the inflow-side flow passage and the first outflow-side passage are not in fluid communication with each other;

a controller that controls switching of the three-way valve; and three temperature sensors that respectively acquire cooling liquid temperatures of the three flow passages, wherein the three temperature sensors acquire a first temperature, which is a cooling liquid temperature of any one of the two flow passages that are controlled to fluidly communicate with each other, and a second temperature, which is a cooling liquid temperature of the remaining flow passage of the three flow passages that is not controlled to fluidly communicate, and the controller determines that the three-way valve is in an intermediate fixation state that is a malfunction condition in which the first outflow-side flow passage and the second outflow-side flow passage simultaneously fluidly communicate with the inflow-side flow passage, when a cooling liquid temperature difference between the first temperature and the second temperature is smaller than a predetermined value.

2. The cooling apparatus according to claim 1, wherein the three temperature sensors includes an inflow-side temperature sensor that acquires a cooling liquid temperature of the inflow-side flow passage, a first outflow-side temperature sensor that acquires a cooling liquid temperature of the first outflow-side flow passage, and a second outflow-side temperature sensor that acquires a cooling liquid temperature of the second outflow-side flow passage, the controller determines, in the first operable state, that the intermediate fixation state is established when a difference between either of the cooling liquid temperature acquired by the inflow-side temperature sensor or the cooling liquid temperature acquired by the first outflow-side temperature sensor, and the cooling liquid temperature acquired by the second outflow-side temperature sensor, is smaller than the predetermined value, and the controller determines, in the second operable state, that the intermediate fixation state is established when a difference between either of the cooling liquid temperature acquired by the inflow-side temperature sensor or the cooling liquid temperature acquired by the second outflow-side temperature sensor, and the cooling liquid temperature acquired by the first outflow-side temperature sensor, is smaller than the predetermined value.

3. The cooling apparatus according to claim 2, wherein the controller further determines that the three-way valve is in a first one-side fixation state of being unable to operate in the second operable state when a difference in the cooling liquid temperatures between the inflow-side flow passage and the second outflow-side flow passage is larger than the predetermined value even though the second operable state is instructed to the three-way valve; and the controller further determines that the three-way valve is in a second one-side fixation state of being unable to operate in the first operable state when a difference in the cooling liquid temperatures between the inflow-side flow passage and the first outflow-side flow passage is larger than the predetermined value even though the first operable state is instructed to the three-way valve.

4. The cooling apparatus according to claim 3, wherein the controller further determines whether the intermediate fixation state is established after the three-way valve has been determined to not be in the first one-side fixation state or the second one-side fixation state.

5. The cooling apparatus according to claim 2, wherein the inflow-side flow passage is connected to a radiator, the first outflow-side flow passage is a storage battery cooling flow passage used to cool a storage battery, and the second outflow-side flow passage is a bypass flow passage that is guided to the radiator by bypassing the storage battery cooling flow passage.

6. The cooling apparatus according to claim 5, wherein a cooling liquid flowing out from the storage battery cooling flow passage and the bypass flow passage is guided to the radiator through a high-temperature heat element cooling flow passage used to cool a high-temperature heat element.

7. The cooling apparatus according to claim 6, wherein the high-temperature heat element is a charger.

8. The cooling apparatus according to claim 7, wherein the controller controls the three-way valve to be in the second operable state during charging of the storage battery, and the controller further determines whether the intermediate fixation state is established during the charging of the storage battery.

9. The cooling apparatus according to claim 1, wherein the controller further determines whether the intermediate fixation state is established after the cooling liquid circulates through the cooling circuit for a predetermined time or more.

10. The cooling apparatus according to claim 1, wherein the controller initiates a visual display on an instrument panel or an audible alarm sound generation that notifies a driver when the controller determines that the intermediate state is established.

* * * * *